(12) United States Patent
Su et al.

(10) Patent No.: US 11,018,049 B2
(45) Date of Patent: May 25, 2021

(54) MANUFACTURING METHOD OF ISOLATION STRUCTURE

(71) Applicants: UNITED MICROELECTRONICS CORP., Hsin-Chu (TW); Fujian Jinhua Integrated Circuit Co., Ltd., Quanzhou (CN)

(72) Inventors: Yu-Shan Su, Taipei (TW); Chia-Wei Wu, Taichung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/028,443

(22) Filed: Jul. 6, 2018

(65) Prior Publication Data
US 2019/0074210 A1    Mar. 7, 2019

(30) Foreign Application Priority Data
Sep. 4, 2017    (CN) .......................... 201710785058.5

(51) Int. Cl.
*H01L 21/762*    (2006.01)
*H01L 21/477*    (2006.01)
*H01L 21/768*    (2006.01)

(52) U.S. Cl.
CPC ...... *H01L 21/76224* (2013.01); *H01L 21/477* (2013.01); *H01L 21/76283* (2013.01); *H01L 21/76831* (2013.01)

(58) Field of Classification Search
CPC ......... H01L 21/76224; H01L 21/76831; H01L 21/76283
See application file for complete search history.

(56) References Cited

U.S. PATENT DOCUMENTS

| 5,968,610 A | 10/1999 | Liu |
| 5,976,947 A | 11/1999 | Reinberg |
| 6,350,662 B1 | 2/2002 | Thei |
| 6,436,790 B2 * | 8/2002 | Ito .................... H01L 21/76224 257/E21.546 |
| 6,791,155 B1 * | 9/2004 | Lo ..................... H01L 21/76224 257/506 |
| 7,163,899 B1 | 1/2007 | Cho |

(Continued)

FOREIGN PATENT DOCUMENTS

| CN | 105489547 A | 4/2016 |
| CN | 106935595 A | 7/2017 |

*Primary Examiner* — Didarul A Mazumder
*Assistant Examiner* — Wasiul Haider
(74) *Attorney, Agent, or Firm* — Winston Hsu

(57) ABSTRACT

A manufacturing method of an isolation structure includes the following steps. A semiconductor substrate is provided. A trench is formed in the semiconductor substrate. A first film forming process is performed to form a first dielectric layer conformally on the semiconductor substrate and conformally in the trench. An annealing process is performed to densify the first dielectric layer and convert the first dielectric layer into a second dielectric layer. A thickness of the second dielectric layer is less than a thickness of the first dielectric layer. A second film forming process is performed after the annealing process to form a third dielectric layer on the second dielectric layer and in the trench. The trench is filled with the second dielectric layer and the third dielectric layer.

13 Claims, 3 Drawing Sheets

(56) References Cited

U.S. PATENT DOCUMENTS

| | | |
|---|---|---|
| 7,199,040 B2 | 4/2007 | Yang |
| 7,238,586 B2 | 7/2007 | Hsu |
| 7,947,568 B2 | 5/2011 | Sakamoto |
| 2004/0259384 A1 | 12/2004 | Nag |
| 2005/0205110 A1* | 9/2005 | Kao ................... H01J 37/32082 134/1.1 |
| 2008/0166888 A1* | 7/2008 | Hsu ................... H01L 21/02164 438/787 |
| 2008/0305609 A1 | 12/2008 | Shih |
| 2009/0298294 A1 | 12/2009 | Chen |
| 2011/0129990 A1* | 6/2011 | Mandrekar ......... H01L 21/2256 438/558 |
| 2012/0139080 A1* | 6/2012 | Wang ................... H01L 21/743 257/506 |
| 2015/0357187 A1* | 12/2015 | Morimoto ......... H01L 21/76892 438/4 |
| 2016/0099168 A1* | 4/2016 | Ryan ................. H01L 21/76224 438/423 |
| 2017/0117498 A1* | 4/2017 | Takechi .............. H01L 51/0097 |
| 2017/0148674 A1* | 5/2017 | Lu ..................... H01L 21/76831 |
| 2018/0040505 A1* | 2/2018 | Gaan ..................... H01L 21/324 |

* cited by examiner

MANUFACTURING METHOD OF ISOLATION STRUCTURE

BACKGROUND OF THE INVENTION

1. Field of the Invention

The present invention relates to a manufacturing method of an isolation structure, and more particularly, to a manufacturing method of an isolation structure formed in a trench.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. In addition, isolation structures are disposed in integrated circuits for improving the electrical interference issue between adjacent devices, and the size of the isolation structure has to become smaller too because the integrity of the integrated circuit becomes higher and higher. It becomes more difficult to manufacture the isolation structures, and many process issues are generated. The manufacturing yield and the operation performance of the product are influenced accordingly.

SUMMARY OF THE INVENTION

A manufacturing method of an isolation structure is provided in the present invention. An annealing process is used to densify a first dielectric layer formed in a trench for improving a void issue in the trench after a subsequent process for filling the trench. The manufacturing yield and the quality of the isolation structure may be enhanced accordingly.

According to an embodiment of the present invention, a manufacturing method of an isolation structure is provided. The manufacturing method includes the following steps. A semiconductor substrate is provided. A trench is formed in the semiconductor substrate. A first film forming process is performed to conformally form a first dielectric layer on the semiconductor substrate and in the trench. An annealing process is performed to densify the first dielectric layer and convert the first dielectric layer into a second dielectric layer. A thickness of the second dielectric layer is less than a thickness of the first dielectric layer. A second film forming process is performed after the annealing process to form a third dielectric layer on the second dielectric layer and in the trench. The trench is filled with the second dielectric layer and the third dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a manufacturing method of an isolation structure according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

Figure 1:
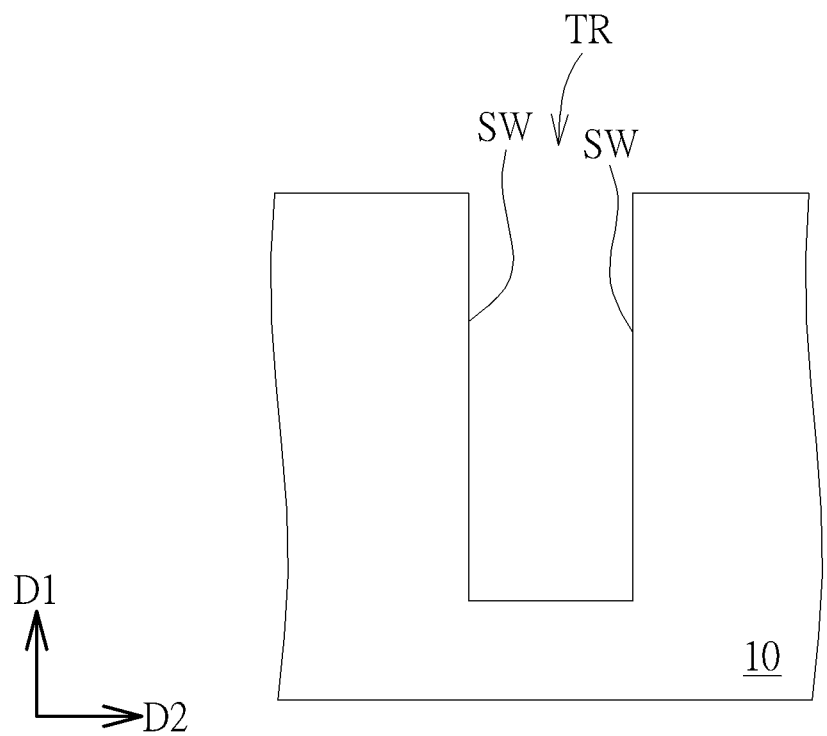

Please refer to FIGS. 1-5. FIGS. 1-5 are schematic drawings illustrating a manufacturing method of an isolation structure according to an embodiment of the present invention. A manufacturing method of an isolation structure is provided in this embodiment. The manufacturing method includes the following steps. Firstly, as shown in FIG. 1, a semiconductor substrate 10 is provided. A trench TR is then formed in the semiconductor substrate 10. The semiconductor substrate 10 may include a silicon substrate, an epitaxial silicon substrate, a silicon germanium substrate, a silicon carbide substrate, or a silicon-on-insulator (SOI) substrate, but not limited thereto. The trench TR may be formed by an etching process, such as an anisotropic etching process, for etching the semiconductor substrate 10 in a thickness direction of the semiconductor substrate 10 (such as a first direction D1 shown in FIG. 1), but not limited thereto. In other embodiments of the present invention, the trench TR may also be formed by other approaches. It is worth noting that a width of the trench TR in a horizontal direction (such as a second direction D2 shown in FIG. 1) is smaller than a depth of the trench TR in the first direction D1, and the trench TR may be regarded as a trench having higher aspect ratio, but not limited thereto.

Figure 2:
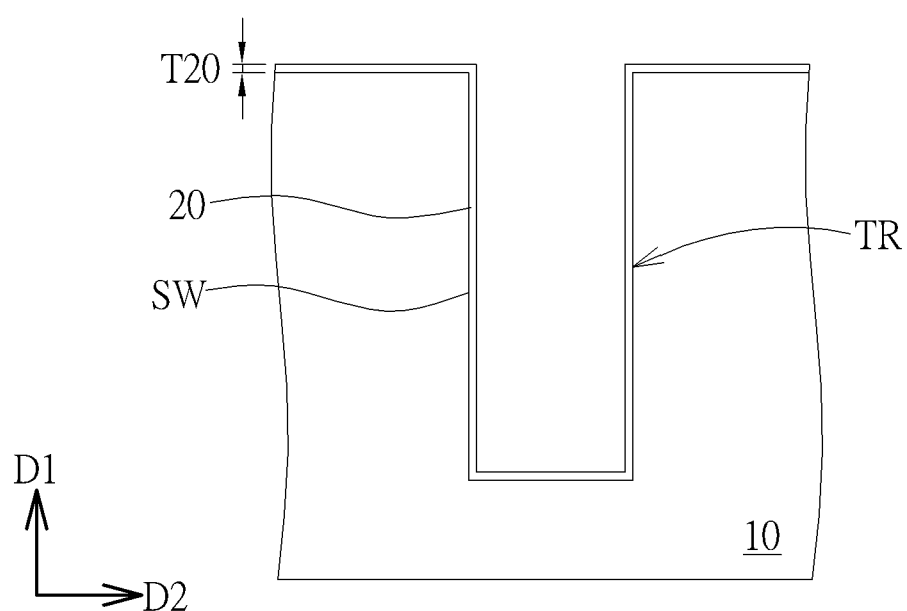
Figure 3:
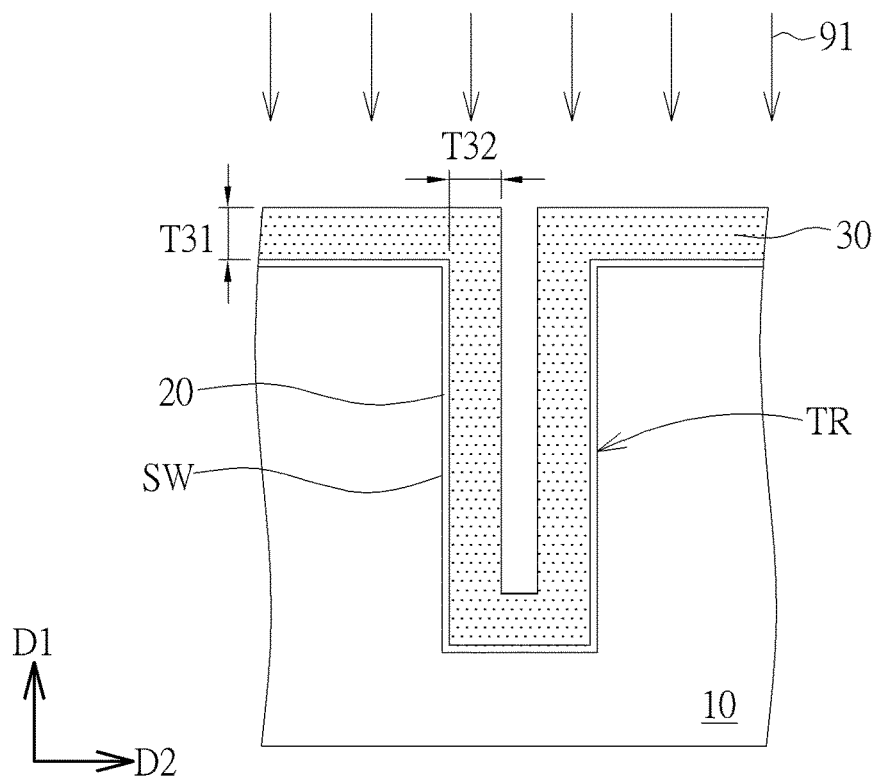

As shown in FIG. 2 and FIG. 3, a first film forming process 91 is performed to conformally form a first dielectric layer 30 on the semiconductor substrate 10 and in the trench TR. In some embodiments, a liner 20 maybe formed conformally on the semiconductor substrate 10 and in the trench TR before the first film forming process 91. The liner 20 may include an oxide layer formed by an oxidation treatment, such as an in-situ steam generation (ISSG) technology, but not limited thereto. In some embodiments, the liner 20 may be formed by other suitable processes and/or other suitable materials, and the first dielectric layer 30 may be formed directly without forming the liner 20 first in some embodiments. In other words, when the liner 20 is formed, the first dielectric layer 30 may be formed conformally on the liner 20. When the liner 20 is formed by the ISSG process, the thickness of the liner 20 (such as a first thickness T20 shown in FIG. 2) maybe relatively thinner and uniform. Therefore, the thickness of the liner 20 formed on the top surface of the semiconductor substrate 10 in the first direction D1 may be substantially equal to the thickness of the liner 20 formed on a sidewall SW of the trench TR, but not limited thereto. Additionally, the first thickness T20 of the liner 20 is less than the thickness of the first dielectric layer 30 preferably. For instance, the first dielectric layer 30 formed on the semiconductor substrate 10 may have a second thickness T31 in the first direction D1, and the first dielectric layer 30 formed on the sidewall SW of the trench TR may have a third thickness T32 in the second direction D2. The first thickness T20 of the liner 20 may be less than the second thickness T31 and the third thickness T32 of the first dielectric layer 30, but not limited thereto.

It is worth noting that the trench TR is not fully filled with the first dielectric layer 30, and the sum of the first thickness T20 of the liner 20 and the third thickness T32 of the first dielectric layer 30 is equal to a half of the width of the trench TR in the second direction D2 preferably. Additionally, in some embodiments, the first film forming process 91 for forming the first dielectric layer 30 may include a deposition process, such as an atomic layer deposition (ALD) process, and the material of the first dielectric layer 30 may include oxide, such as silicon oxide, but not limited thereto. In some embodiments, other suitable processes (such as other suitable chemical vapor deposition processes or other suitable physical vapor deposition processes) and/or other suitable materials (such as other suitable oxide dielectric materials, nitride dielectric materials, and/or oxynitride dielectric materials) may also be applied to form the first dielectric layer 30. The density of the liner 20 may be different from the density of the first dielectric layer 30 because the liner 20 and the first dielectric layer 30 may be formed by different processes respectively. For example, a density of the liner 20 may be higher than a density of the first dielectric layer 30 when the liner 20 is an oxide layer formed by the ISSG process and the first dielectric layer 30 is an oxide layer formed by the ALD process, but not limited thereto.

Figure 4:
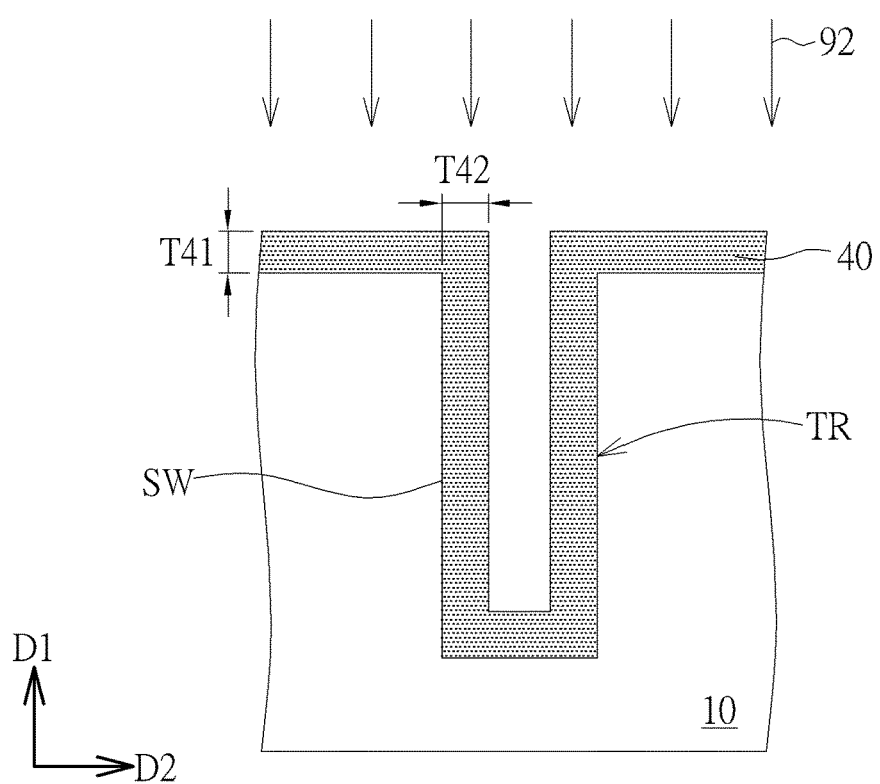

Subsequently, as shown in FIG. 3 and FIG. 4, an annealing process 92 is performed to densify the first dielectric layer 30 and convert the first dielectric layer 30 into a second dielectric layer 40. In some embodiments, the second dielectric layer 40 may be formed by performing the annealing process 20 to the first dielectric layer 30 and the liner 20, but not limited thereto. The second dielectric layer 40 may be formed by performing the annealing process to the first dielectric layer 30 only when there is not any liner formed before the step of forming the first dielectric layer 30. A thickness of the second dielectric layer 40 is less than the thickness of the first dielectric layer 30, and a density of the second dielectric layer 40 is higher than a density of the first dielectric layer 30 because the second dielectric layer 40 may be formed by densifying the first dielectric layer 30 with the annealing process 92. For instance, the second dielectric layer 40 formed on the semiconductor substrate 10 may have a fourth thickness T41 in the first direction D1, and the second dielectric layer 40 formed on the sidewall SW of the trench TR may have a fifth thickness T42 in the second direction D2. The fourth thickness T41 of the second dielectric layer 40 is less than the second thickness T31 of the first dielectric layer 30, and the fifth thickness T42 of the second dielectric layer 40 is less than the third thickness T32 of the first dielectric layer 30. Additionally, a process gas used in the annealing process 92 may be determined in accordance with the material of the first dielectric layer 30 for assisting the annealing process 92 in providing densification effect to the first dielectric layer 30 under the high temperature condition. For example, in some embodiments, the process gas of the annealing process 92 may include nitrogen, argon, hydrogen, or other suitable gas when the first dielectric layer 30 is an oxide layer, such as a silicon oxide layer, but not limited thereto.

Figure 5:
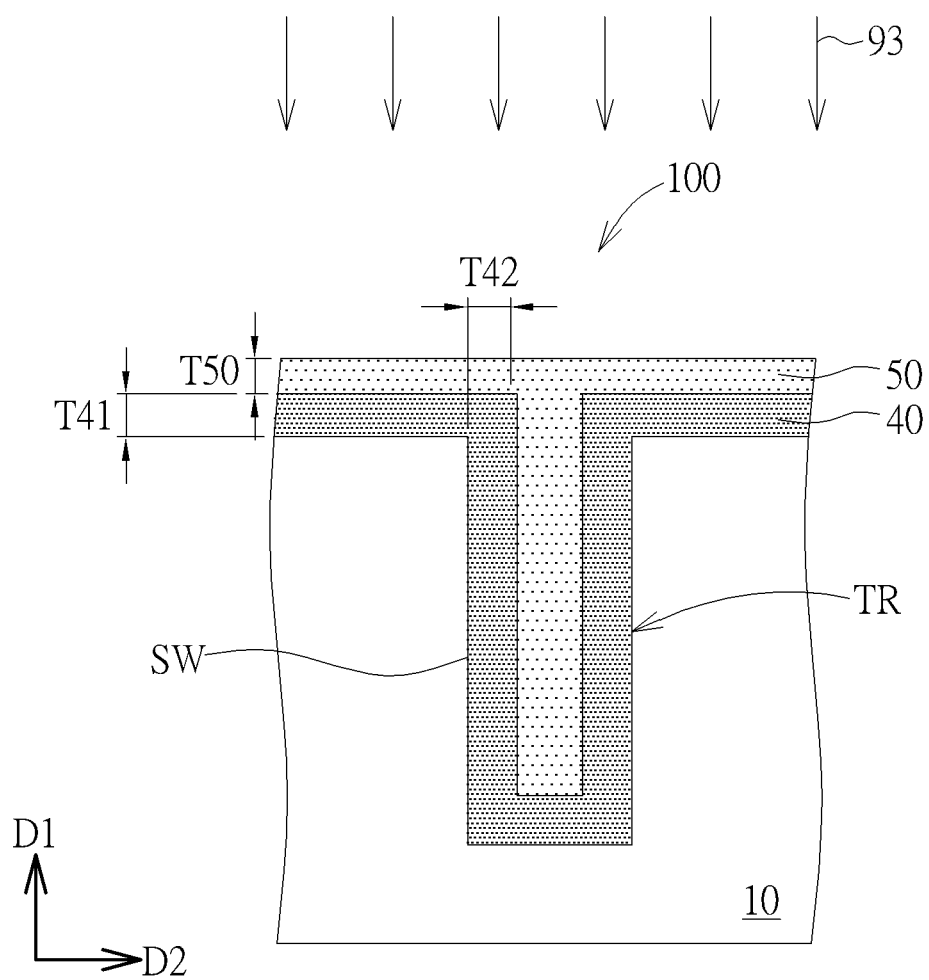

As shown in FIG. 4 and FIG. 5, a second film forming process 93 is then performed after the annealing process 92 to form a third dielectric layer 50 on the second dielectric layer 40 and in the trench TR. The trench TR is fully filled with the second dielectric layer 40 and the third dielectric layer 50 for forming an isolation structure 100. In some embodiments, the third dielectric layer 50 formed outside the trench TR and the second dielectric layer 40 formed outside the trench TR may be removed by a process, such as a chemical mechanical polishing (CMP) process, according to some considerations, but not limited thereto. The isolation structure 100 may be regarded as a trench isolation structure, and the isolation structure 100 may be used to isolate different regions in the semiconductor substrate 10. For example, the isolation structure 100 may be used to define active areas in a semiconductor memory cell array and/or active areas corresponding to different transistors, but not limited thereto.

In some embodiments, the second film forming process 93 for forming the third dielectric layer 50 may include a deposition process, such as an atomic layer deposition (ALD) process, and the material of the third dielectric layer 50 may include oxide, such as silicon oxide, but not limited thereto. In some embodiments, other suitable processes (such as other suitable chemical vapor deposition processes or other suitable physical vapor deposition processes) and/or other suitable materials (such as other suitable oxide dielectric materials, nitride dielectric materials, and/or oxynitride dielectric materials) may also be applied to form the third dielectric layer 50. In other words, the third dielectric layer 50, the second dielectric layer 40, and the first dielectric layer described above may include silicon oxide layers respectively. A density of the third dielectric layer 50 maybe close to the density of the first dielectric layer described above, and the density of the second dielectric layer 40 is higher than the density of the third dielectric layer 50. Because the first dielectric layer 30 is formed in the trench TR and densified before the step of filling the trench TR with the third dielectric layer 50, the ratio of the third dielectric layer 50 in the trench TR may be reduced accordingly. Therefore, the opportunity of forming voids in the dielectric layer having a lower density in the trench TR may be reduced, and negative influences generated by the voids growing in other high temperature processes subsequently performed may be reduced also. Accordingly, in some embodiments, the thickness of the second dielectric layer 40 (such as the fourth thickness T41 and the fifth thickness T42 described above) may be larger than a thickness of the third dielectric layer 50 (such as a sixth thickness T50 shown in FIG. 5), and the ratio of the second dielectric layer 40 in the trench TR may be higher than that of the third dielectric layer 50, but not limited thereto. In other words, the thickness of the first dielectric layer 30 described above (such as the second thickness T31 and the third thickness T32 described above) is larger than the sixth thickness T50 of the third dielectric layer 50.

As shown in FIGS. 3-5, the first film forming process 91, the annealing process 92, and the second film forming process 93 may be performed sequentially in the same apparatus, and the first film forming process 91, the annealing process 92, and the second film forming process 93 may be performed sequentially in the same process chamber for avoiding problems such as outer environment influences, but the present invention is not limited to this. In some embodiments, the first film forming process 91, the annealing process 92, and the second film forming process 93 may be performed in different apparatuses and/or different process chambers. Additionally, in some embodiments, a process temperature of the annealing process 92 may be higher than a process temperature of the first film forming process 91 and a process temperature of the second film forming process 93. For instance, the process temperature of the first film forming process 91 and the second film forming process 93 may substantially range from 400 degrees Celsius to 500 degrees Celsius, and the process temperature of the annealing process 92 maybe higher than 600 degrees Celsius, but not limited thereto. When the first film forming process 91, the annealing process 92, and the second film forming process 93 are performed in the same process chamber, the process chamber may be heated up to the process temperature of the annealing process 92 after the first film forming process 91, and the process chamber may be cooled down to the process temperature of the second film forming process 93 after the annealing process 92, but not limited thereto.

To summarize the above descriptions, in the manufacturing method of the isolation structure according to the present invention, before filling up the trench, the first dielectric layer formed in the trench without filling up the trench is densified by the annealing process for becoming the thinner second dielectric layer having a higher density, and the third dielectric layer is formed to fill up the trench after the annealing process for forming the isolation structure. By the manufacturing method of the present invention, the ratio of the third dielectric layer having a relatively lower density in the trench may be reduced for avoiding forming voids in the dielectric layer within the trench. Negative influences generated by the voids growing in other high temperature processes subsequently performed may be reduced, and the purpose of enhancing the manufacturing yield may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an isolation structure, comprising:
   providing a semiconductor substrate;
   forming a trench in the semiconductor substrate;
   performing a first film forming process to conformally form a first dielectric layer on the semiconductor substrate and in the trench;
   performing an annealing process to densify the first dielectric layer and convert the first dielectric layer into a second dielectric layer, wherein a thickness of the second dielectric layer is less than a thickness of the first dielectric layer; and
   performing a second film forming process after the annealing process to form a third dielectric layer on the second dielectric layer and in the trench, wherein the trench is filled with the second dielectric layer and the third dielectric layer, the thickness of the first dielectric layer is larger than a thickness of the third dielectric layer, and the thickness of the second dielectric layer is larger than the thickness of the third dielectric layer.

2. The manufacturing method of the isolation structure according to claim 1, wherein a density of the second dielectric layer is higher than a density of the first dielectric layer.

3. The manufacturing method of the isolation structure according to claim 1, wherein a density of the second dielectric layer is higher than a density of the third dielectric layer.

4. The manufacturing method of the isolation structure according to claim 1, wherein the first dielectric layer, the second dielectric layer, and the third dielectric layer comprise silicon oxide layers respectively.

5. The manufacturing method of the isolation structure according to claim 1, wherein the first film forming process, the annealing process, and the second film forming process are performed sequentially in the same apparatus.

6. The manufacturing method of the isolation structure according to claim 5, wherein the first film forming process, the annealing process, and the second film forming process are performed sequentially in the same process chamber.

7. The manufacturing method of the isolation structure according to claim 1, wherein a process temperature of the annealing process is higher than a process temperature of the first film forming process and a process temperature of the second film forming process.

8. The manufacturing method of the isolation structure according to claim 1, wherein a process gas of the annealing process comprises nitrogen, argon, or hydrogen.

9. The manufacturing method of the isolation structure according to claim 1, wherein the first film forming process and the second film forming process comprise an atomic layer deposition process respectively.

10. The manufacturing method of the isolation structure according to claim 1, further comprising:
    forming a liner conformally on the semiconductor substrate and in the trench before the step of forming the first dielectric layer, wherein the first dielectric layer is formed conformally on the liner, and a thickness of the liner is less than the thickness of the first dielectric layer.

11. The manufacturing method of the isolation structure according to claim 10, wherein a density of the liner is higher than a density of the first dielectric layer.

12. The manufacturing method of the isolation structure according to claim 11, wherein the first dielectric layer and the liner comprise oxide respectively.

13. The manufacturing method of the isolation structure according to claim 10, wherein the first dielectric layer and the liner are converted into the second dielectric layer by the annealing process.

* * * * *